United States Patent
Valley et al.

(10) Patent No.: US 7,129,503 B2
(45) Date of Patent: Oct. 31, 2006

(54) DETERMINING EMITTER BEAM SIZE FOR DATA STORAGE MEDIUM

(75) Inventors: Jeffrey M. Valley, Corvallis, OR (US); John Liebeskind, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 568 days.

(21) Appl. No.: 10/268,504

(22) Filed: Oct. 9, 2002

(65) Prior Publication Data

US 2004/0071066 A1   Apr. 15, 2004

(51) Int. Cl.
*G11B 9/10* (2006.01)
*H01J 37/244* (2006.01)

(52) U.S. Cl. ............. 250/397; 369/101; 250/491.1
(58) Field of Classification Search ............. None
See application file for complete search history.

(56) References Cited

U.S. PATENT DOCUMENTS

| | | | |
|---|---|---|---|
| 3,409,799 A | 11/1968 | Kurzweil, Jr. et al. | |
| 4,370,554 A * | 1/1983 | Bohlen et al. | 250/491.1 |
| 4,675,528 A * | 6/1987 | Langner et al. | 250/396 R |
| 5,100,231 A | 3/1992 | Sasnett et al. | |
| 5,130,550 A | 7/1992 | Nakamura et al. | |
| 5,302,812 A | 4/1994 | Li et al. | |
| 5,430,292 A * | 7/1995 | Honjo et al. | 250/310 |
| 5,557,596 A * | 9/1996 | Gibson et al. | 369/101 |
| 5,633,747 A | 5/1997 | Nikoonahad | |
| 5,889,750 A | 3/1999 | Summers et al. | |
| 5,912,839 A | 6/1999 | Ovshinsky et al. | |
| 5,923,473 A | 7/1999 | Kelley et al. | |
| 6,114,708 A * | 9/2000 | Kojima et al. | 250/492.23 |

FOREIGN PATENT DOCUMENTS

JP   59058380   4/1984

OTHER PUBLICATIONS

Apr. 13, 2004 European Search Report for EP Application No. 03255978.

* cited by examiner

*Primary Examiner*—Jack I. Berman

(57) ABSTRACT

Determining a beam size of an emitter for a data storage medium is disclosed. The emitter, having an emitted beam, is moved across conductor of a detector. Current through the conductor, resulting from the emitted beam as the emitter moves across the detector, is measured. The size of the emitted beam of the emitter is determined based on the position of the emitter and the measured current.

31 Claims, 9 Drawing Sheets

DETERMINING EMITTER BEAM SIZE FOR DATA STORAGE MEDIUM

BACKGROUND

Storage media for computers and other types of electronic devices generally come in two types: volatile memory and non-volatile memory. Volatile memory loses its contents when power is no longer being supplied to the memory, whereas non-volatile memory maintains its contents even when power is not being supplied to the memory. The most common type of volatile memory is random-access memory (RAM), which is most commonly available as and implemented as an integrated circuit (IC). The term data storage medium is used herein in a broad sense, and encompasses IC memory, as well as other types of data storage media.

By comparison, non-volatile memory has perhaps more commonly been available as and implemented as magnetic and optical media, including hard disk drives, floppy disks, compact disc read-only memories (CD-ROM's), CD re-writable (CD-RW) discs, and digital versatile discs (DVD's), among others. Historically, non-volatile memory implemented as an IC was primarily available as ROM that was not re-recordable, such as hard-wired ROM and programmable ROM (PROM). More recently, IC non-volatile memory has become available as various types of flash memory, which is more technically known as electrically erasable PROM (EEPROM).

IC-based data storage media is typically read from and, where applicable, written to, using electric signals. By comparison, magnetic and optical data storage media is typically read from, and where applicable, written to, using magnetic sensors and optical sensors, where the latter usually include some type of optical beam. However, a new type of data storage medium has been contemplated that can be implemented as an IC, but that is read from and written to using an emitted beam of electrons. A phase-changeable layer is present that can be switched between two different phases by being subjected to the emitted beam. The two phases correspond to different logical values, such as binary one and binary zero.

For reading the logical value stored in the phase-changeable layer, the medium is subjected to the emitted beam at a low intensity, whereas for writing a logical value to the phase-changeable layer, the medium is subjected to the emitted beam at a high intensity. For such reading from and writing to the re-recordable data storage medium, the spot size of the emitted beam, which is also referred to as just the size of the emitted beam, is desired to be a predetermined size. If the size of the beam varies from this desired size, the storage density may be reduced and errors may result when reading from or writing to the medium. Beam size variation can occur, for instance, because of manufacturing tolerances in the gap between the emitter and media, the divergence angle of the electrons emanating from the emitter, as well as the effectiveness of the lens to focus the emitter.

SUMMARY OF THE INVENTION

The invention can be embodied as a method in which an emitter having an emitted beam is moved across conductor of a detector. Current through the conductor, resulting from the emitted beam as the emitter moves across the detector, is measured. The size of the emitted beam of the emitter is determined based on the position of the emitter and the measured current.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Overview

Figure 1A:
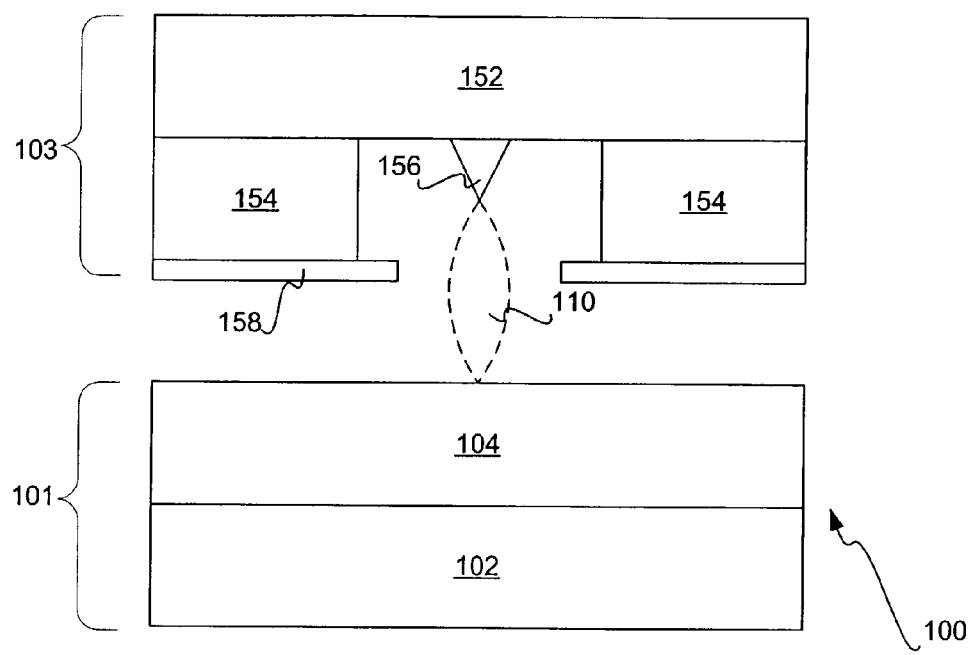
FIG. 1A is a diagram of a cross-sectional view of an example of a re-recordable data storage device, in conjunction with which at least some embodiments of the invention can be implemented.

FIG. 1A shows a cross-section of a re-recordable data storage device 100, in conjunction with which at least some embodiments of the invention. The data storage device 100 includes a data storage medium 101, made up of a substrate 102 with a phase-changeable layer 104. The storage device 100 also includes an emitter device 103, made up of a second substrate 152 upon which at least one electron emitter 156 has been fabricated within a layer 154, and a focusing lens 158. The focusing lens 158 serves to focus the emitted beam 110 emitted by the emitter 156 on the phase changeable layer 104 via a voltage applied thereto. Other types of data storage devices may be amenable to implementation with the same or other embodiments of the invention.

Figure 1B:
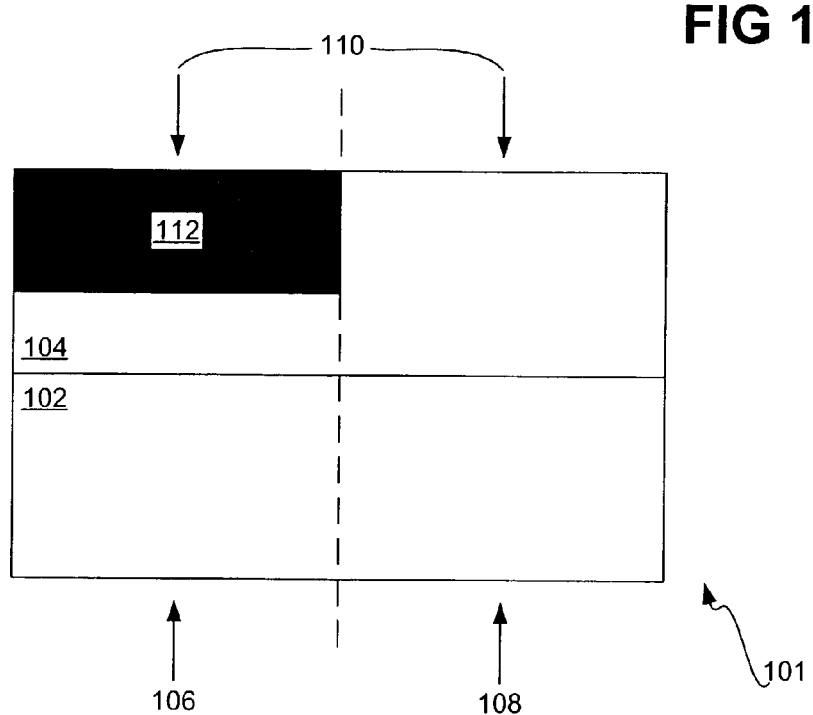
FIG. 1B is a diagram of a cross-sectional view of an example of a re-recordable data storage medium, in conjunction with which at least some embodiments of the invention can be implemented.

FIG. 1B shows a cross-section of an example of the re-recordable data storage medium 101 in more detail, in conjunction with which at least some embodiments of the invention can be implemented. Other types of data storage media may be amenable to implementation with the same or other embodiments of the invention. The data storage media 101 includes the substrate 102, and the phase-changeable layer 104. Other layers and materials besides the substrate 102 and the phase-changeable layer 104 may also be present within the medium 101, as can be appreciated by those of ordinary skill within the art.

The medium 101 is divided into two logical memory cells 106 and 108. A logical value can be stored in the phase-changeable layer 104 of each of the memory cells 106 and 108. The logical value stored in the phase-changeable layer 104 corresponds to the phase of the layer 104. For instance, where the layer 104 is indium selenide, there may be two phases: a crystalline phase corresponding to one storable logical value, and an amorphous phase corresponding to another storable logical value. As shown in FIG. 1B, the phase-changeable layer 104 of the memory cell 108 is in the amorphous phase, whereas the phase of the layer 104 of the memory cell 106 is in the crystalline phase, as indicated by the shaded portion 112.

To read the logical value stored in the memory cells 106 and 108, the medium 101 is subjected to an emitted beam 110, such as an electron beam, at low energy. More particularly, the memory cell 106 is subjected to the beam 110 to read the logical value stored in the cell 106, and the memory cell 108 is subjected to the beam 110 to read the logical value stored in the cell 108. Subjecting the medium 101 to the beam 110 induces a current through the medium 101, which varies depending on the phase of the memory cell that is specifically subjected to the beam 110. The current is then detected, and correlated with the logical value stored in the memory cell. That is, if the current is equal to one value, then the phase of the memory cell subjected to the beam 110 is crystalline, corresponding to one logical value. If the current is equal to another value, then the phase of the cell is amorphous, corresponding to another logical value.

To change the logical value stored in the memory cells 106 and 108, the selected memory cell of the medium 101 is subject to the emitted beam 110, but at a higher energy for a specific duration. This changes the phase of the selected memory cell from crystalline to amorphous, or vice versa. More specifically, the phase of the selected memory cell is changed by a combination of emitter power and duration. To change from amorphous to crystalline, the material is heated and the emitter is ramped down slowly, giving the material an opportunity to cool slowly and form a crystalline structure. To change from crystalline to amorphous, the material is heated and cooled rapidly, not giving the material the time to form a crystalline structure. Thus, the logical value stored in the memory cell is correspondingly changed. It is noted that whereas only two memory cells 106 and 108 are shown, this is for illustrative clarity. In actuality, there is likely to be hundreds, thousands, or more memory cells populating the re-recordable data storage medium 101.

Figure 2:
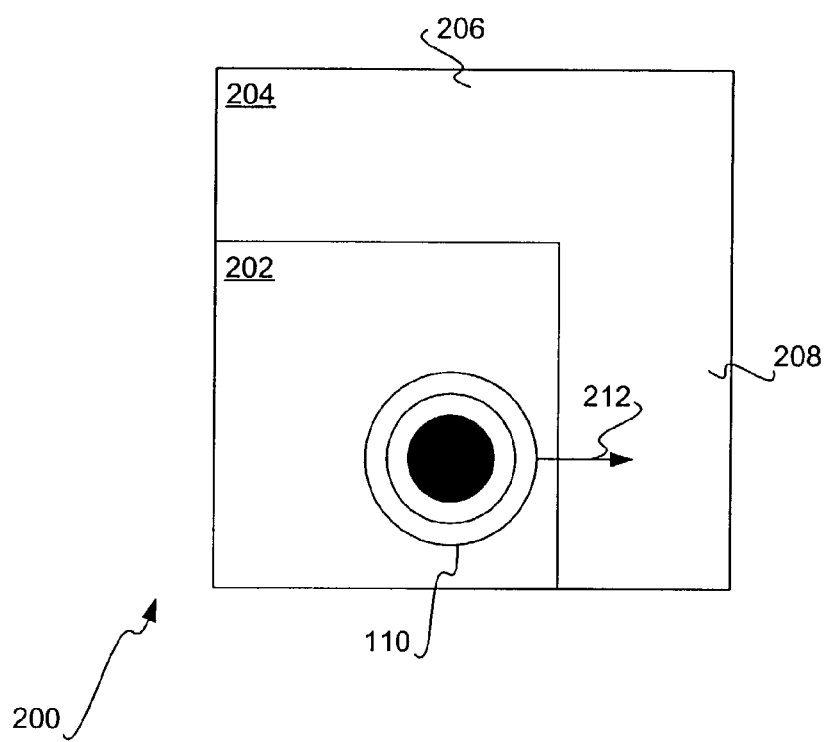
FIG. 2 is a diagram of a top view of a detector used to assist determining beam size, according to an embodiment of the invention.

FIG. 2 shows the top view of a detector 200, according to an embodiment of the invention, which can be used in conjunction with the re-recordable data storage device 100 to assist determination of the size of the emitted beam 110. The size of the emitted beam 110 is the spot size of the beam 110. That is, the beam size is how large a spot the emitted beam 110 casts on the medium 101. The emitted beam 110 is emitted by the electron emitter 156, and the size of the beam 110 is based on the divergence angle of the electrons emanating from the emitter 156, the voltage supplied to the focusing lens 158 and the distance of the gap 160 from the emitter 156 to the phase-changeable layer 104. The detector 200 is used to assist in the determination of the beam size, so that the voltage supplied to the focusing lens 158 can be adjusted or calibrated to ensure a desired beam size.

The detector 200 includes a first conductor 202 and a second conductor 204, which are desirably insulated from one another either vertically, horizontally, or both vertically and horizontally. The first conductor 202 is an electron collector, which collects electrons emitted by the emitted beam 110 of the emitter 156, and is preferably rectangularly shaped. The emitter 156 and its emitted beam 110 moves from over the first conductor 202, across and over to the second conductor 204, such as in the direction 212 indicated in FIG. 2. As the emitted beam 110 begins to move over the second conductor 204, the impinging electrons generate a current in the second conductor 204, which is measured and used to determine the size of the emitted beam 110.

The second conductor 204 is preferably L-shaped, as indicated in FIG. 2, and includes a first leg 206 and a second leg 208. By being L-shaped, the spot size of the beam 110 can be determined relative to the position of the emitter 156 and its emitted beam 110 in two axes. The emitted beam 110 is measured in two axes or directions to determine whether the electron beam is symmetrical about the two axes or suffers from some form of astigmatism. The first direction is shown in FIG. 2 as indicated by the arrow 212, from over the first conductor 202 to over the second leg 208 of the second conductor 204. The second direction is that which the emitter 156 and its emitted beam 110 travels from over the first conductor 202 to over the first leg 206 of the second conductor 204, perpendicular to the first direction.

Figure 3:
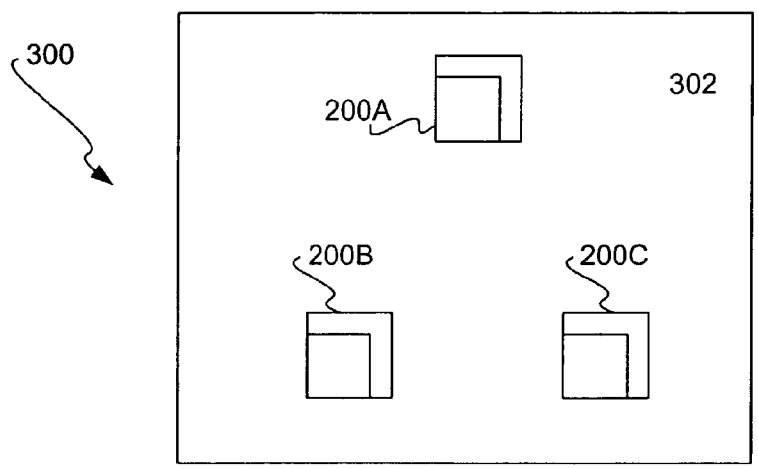
FIG. 3 is a diagram of semiconductor wafer including a number of detectors, according to an embodiment of the invention.

Furthermore, there may be more than one detector 200 on the semiconductor wafer assembly or individual semiconductor die on which the re-recordable data storage medium 101 is fabricated, to determine the spot size of the emitted beam 110 at different positions on the wafer or die. This array of detectors allows for the detection and compensation of a number of manufacturing variables including the spacing between the emitter 156 and phase-changeable media. FIG. 3, for instance, shows an example semiconductor wafer 300 on which three instances of the detector 200 are present, according to an embodiment of the invention. These instances are indicated as the detectors 200A, 200B, and 200C. The detectors 200A, 200B, and 200C are spaced as far apart from one another as possible on the wafer 300. The beam size can thus be determined in three different positions on the semiconductor wafer 300, and may be interpolated for the other positions on the wafer 300. The other positions 302 on the wafer 300 are populated by memory cells of the re-recordable data storage medium 101.

Figure 4:
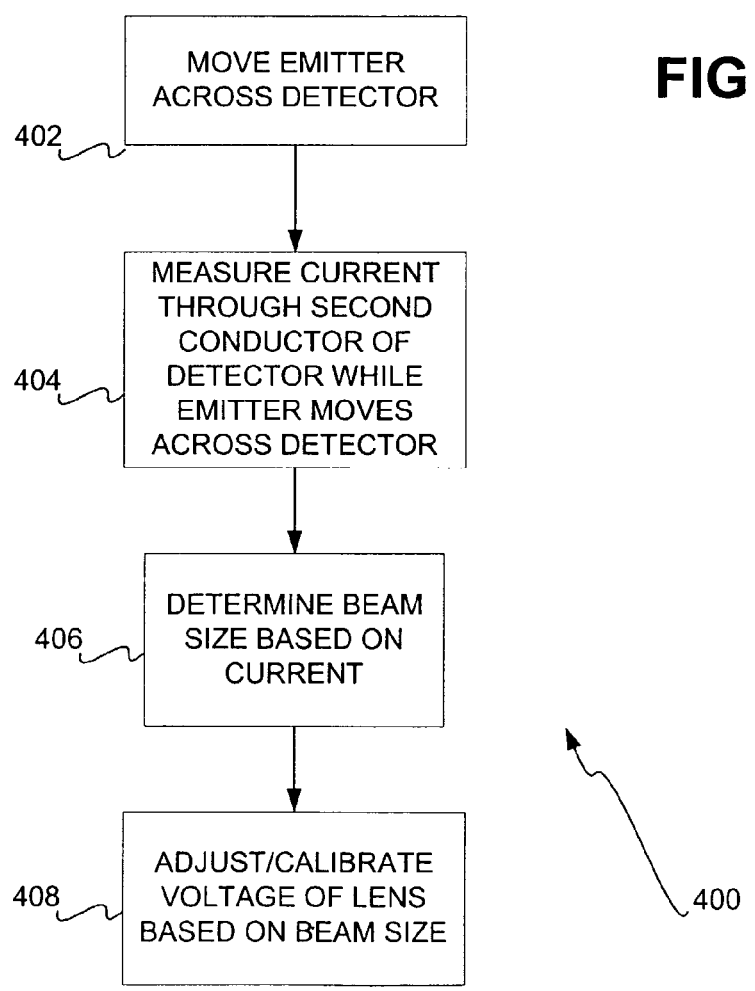
FIG. 4 is a method for determining beam size using a detector, according to an embodiment of the invention.

FIG. 4 shows a method 400 for determining the spot size of the emitted beam 110 utilizing the detector 200, according to an embodiment of the invention. The emitter 156 and its emitted beam 110 is moved across the detector 200 (402), specifically from over the first conductor 202 to over the second conductor 204. As the emitter 156 moves across the detector 200, the current induced within the second conductor 204 by the emitted beam 110 is measured (404). The size of the emitted beam 110 is determined based on the current measured (406), so that the voltage of the focusing lens 158 can be adjusted or calibrated based on the determined beam size, to achieve a desired size of the emitted beam 110 (408).

Specifics as to how the size of the beam 110 is determined based on the current measured in 406 of the method 400, according to varying embodiments of the invention, are described in the next section of the detailed description. More specific detectors and methods, consistent with the detector 200 of FIG. 2 and the method 400 of FIG. 4, according to varying embodiment of the invention, are also described in succeeding sections of the detailed description.

Determining beam size based on measured current

The beam size is determined based on the measured current generally in accordance with a beam power profile. The beam power profile is the profile of the power of the emitted beam 110. The intensity of the beam 110 is greatest at a center of the spot that the beam 110 casts, and decreases outward from the center. The profile of the beam power dictates how the intensity of the power of the emitted beam 110 decreases away from the center of the beam 110.

Figure 5:
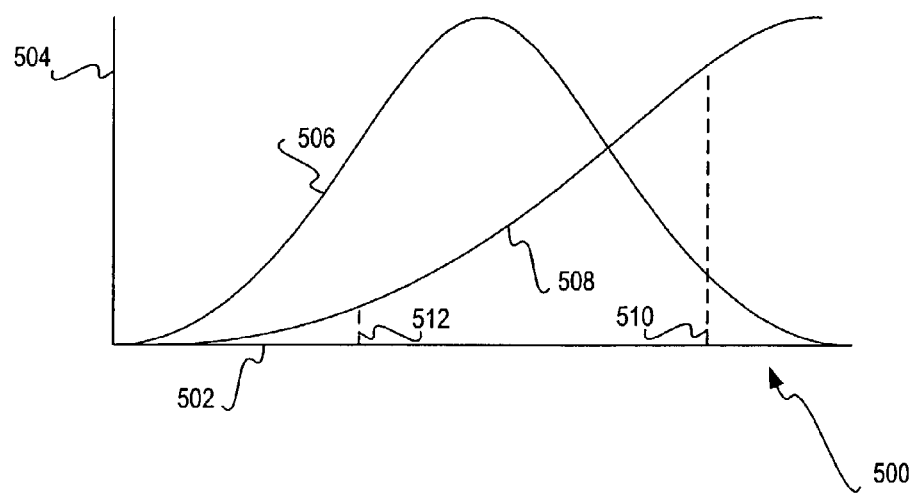
FIG. 5 is a graph of an example Gaussian beam power profile of an emitted beam, and its integration, according to an embodiment of the invention.

FIG. 5 shows a graph 500 of an example of an electron flux profile 506, according to an embodiment of the invention. The x-axis 502 defines the horizontal position of the profile 506. The y-axis 504 defines the normalized intensity of the flux of the beam 110 relative to the position indicated by the x-axis 502. In this example, the profile 506 as indicated in FIG. 5 is Gaussian, and as such is a bell-shaped curve. The electron flux of the emitted beam 110 rapidly decreases away from the center position of the profile 506 and consequently makes detection of the edge of the beam difficult. Furthermore, both the profile 506 and the curve 508 are normalized as to the y-axis 504.

As the emitted beam 110 translates from the conductor 202 of FIG. 2 in the direction indicated by 212, an electric current is collected by conductor 206. The current signal is denoted in FIG. 5 by the curve 508 with horizontal, or x, axis 502 indicating the position and vertical, or y, axis 504 indicating current. The electron flux profile 506 is determined by integrating the current indicated by 508. This beam profile is shown by the curve 506 that depicts the electron flux per unit length along the horizontal axis 502.

Mathematically, the electron beam flux spatial profile as represented by the curve 506 has the form:

$$\exp\left\{-\frac{1}{2}\left(\frac{x}{\sigma_x}\right)^2\right\}\exp\left\{-\frac{1}{2}\left(\frac{z}{\sigma_z}\right)^2\right\}, \quad (1)$$

where x and z indicate the position within the spot cast by the emitted beam 110 away from the spot center, on a Cartesian axis with the (0,0) point at the spot center and $\sigma_x$ and $\sigma_z$ represent the beam width in the x and z axes respectively. To determine the total current collected by the detector, the profile is first integrated along the z-axis from minus infinity to plus infinity:

$$\sqrt{\pi}\,\sigma_x \exp\left\{-\frac{1}{2}\left(\frac{x}{\sigma_x}\right)^2\right\}. \quad (2)$$

The x-axis corresponds to the x-axis 502 of FIG. 5, and the direction indicated by the arrow 212 of FIG. 2. The z-axis, along which the integration is performed, corresponds to the direction perpendicular to the arrow 212 of FIG. 2 but still in the plane of FIG. 2. The mathematical term (2) specifically represents the Gaussian beam profile represented as the profile 506 over the x-axis 502.

The total current hitting the detector is then determined by integrating from x=a to infinity, where a is the location where the emitted beam 110 hits the conductor 208. This integration is the curve 508 shown in FIG. 5. The integral may be determined numerically, or by using appropriate error functions, as can be appreciated by those of ordinary skill within the art. As the beam 110 translates across the conductor 208 of FIG. 2, it is the integral represented by the curve 508 that is measured. The current measured corresponds to the curve 508. If the electron flux profile is not Gaussian, the profile can be determined numerically if the profile is assumed to be symmetric, by using the Abel Inversion, known within the art, or other numerical techniques. If just a relative beam size is desired, an arbitrary convention can be used to define the beam size relative to the integral or measured profile.

In one embodiment, the beam size is the diameter of the spot cast by the emitted beam 110, and is determined as the difference in position of the 90% intensity position and the 10% intensity position on the curve 508. That is, the dotted line 510 indicates on the x-axis 502 where the curve 508 is at 90% of maximum intensity, and the dotted line 512 indicates on the x-axis 502 where the curve 508 is at 10% of maximum intensity. Subtracting the value represented by the dotted line 512 from the value represented by the dotted line 510 thus yields the beam size of the emitted beam 110. More generally, the size of the beam 110 is determined as a position of the emitter 156, and hence the beam 110, relative to the detector 200 of FIG. 2 where the current has been measured at a first value, minus the position of the emitter 156 relative to the detector 200 where the current has been measured at a second value. The first and second values may thus be 90% and 10% of maximum intensity, respectively.

The beam size of the emitted beam 110 may also be determined relative to the curve 508 and/or the profile 506 in other ways, in other embodiments of the invention. For example, the full-width half maximum (FWHM) approach determines the beam width at the distance between the positions where the beam intensity is 50% of the peak intensity. Furthermore, whereas FIG. 5 has been described in relation to an integration process being performed, it can also be performed as to a differentiation process, as can be appreciated by those of ordinary skill within the art.

Detector implementations

Figure 6:
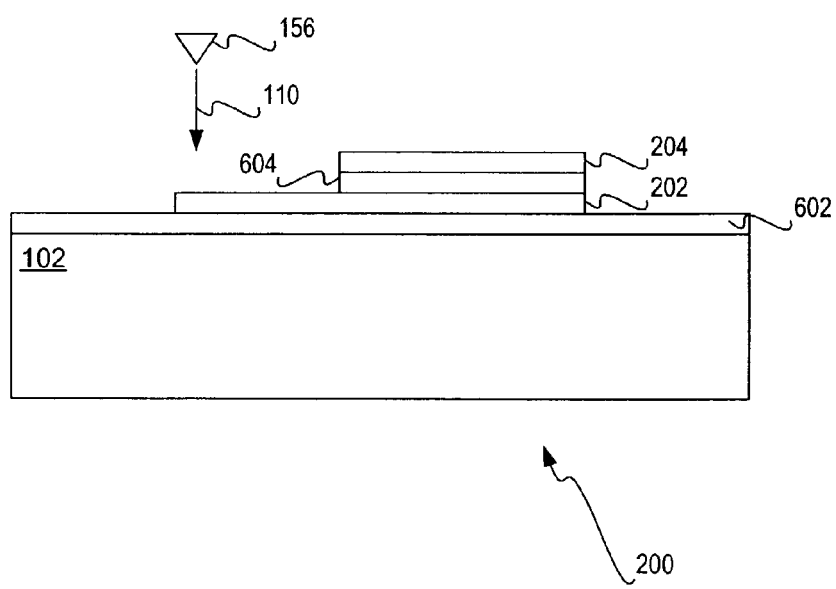
FIG. 6 is a diagram of a cross-sectional view of the detector of FIG. 2, according to an embodiment of the invention.

FIG. 6 shows the cross-sectional view of the detector 200 of FIG. 2, according to a particular embodiment of the invention. The detector 200 includes a dielectric layer 602 over the substrate 102. The first conductor 202, which is the electron collection layer, is over the dielectric layer 602. Another dielectric layer 604 separates the second conductor 204 and the first conductor 202. As has been indicated, the second conductor 204 is for indirectly determining the size of the emitted beam 110 based on current therethrough. The emitter 156 is shown that emits the emitted beam 110.

Generally, the second conductor 204 is positioned relative to the first conductor 202 such that both conductors 202 and 204 are each at least partially exposed. More specifically, in the embodiment of FIG. 6, the second conductor 204 is positioned over the first conductor 202 such that the first conductor 202 is partially exposed. The second dielectric layer 604 is similarly sized to the second conductor 204, and the second conductor 204 is smaller in size than the first conductor 202.

Figure 7:
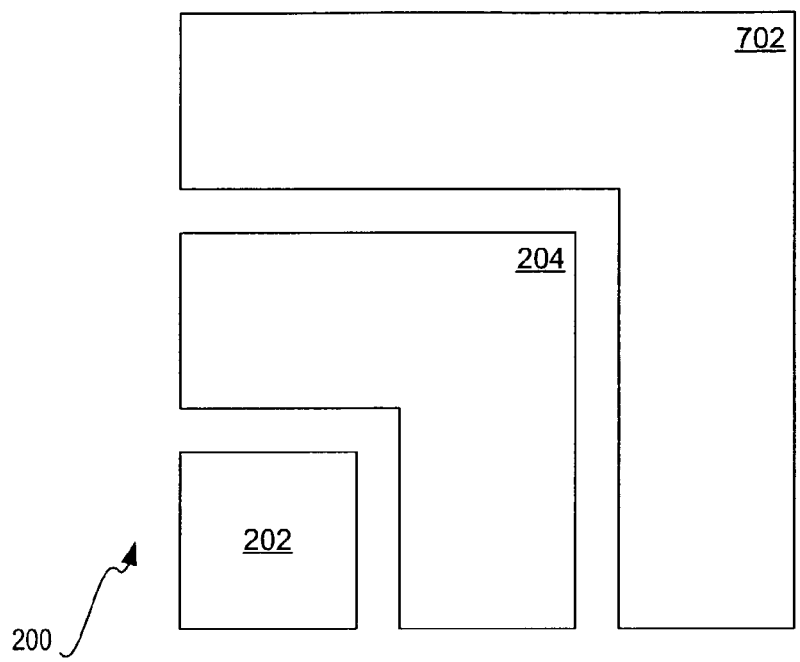
FIGS. 7 and 8 are diagrams of a top view and a cross-sectional view, respectively, of a detector, according to an embodiment of the invention, that is consistent with the embodiment of FIG. 2.
Figure 8:
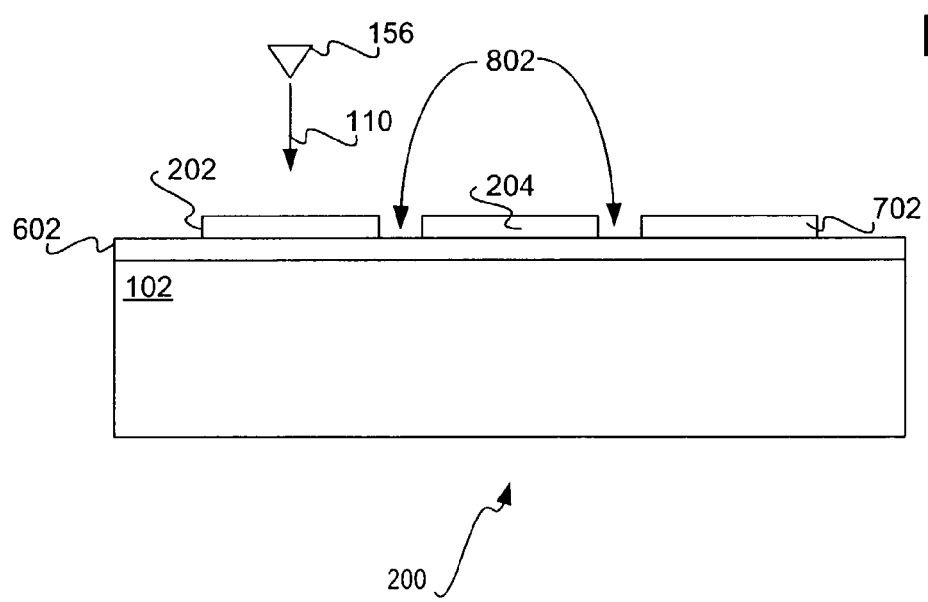

FIGS. 7 and 8 show the top view and the cross-sectional view of the detector 200, according to another particular embodiment of the invention. The detector 200 of the embodiment of FIGS. 7 and 8 is consistent with the detector 200 of FIG. 2. The emitter 156 is again shown that emits the emitted beam 110. The first conductor 202 is thus separate from the conductor 702, even though both conductors 202 and 702 represent the first conductor layer. Like the conductor 204, the conductor 702 is L-shaped, whereas the first conductor 202 is rectangularly shaped. In one embodiment, however, the conductor 702 is not present, such that the conductor 702 is optional. The conductors 202 and 702 and the conductor 204 define bleed resistors or spark gaps 802 therebetween in one embodiment. The dielectric layer 602 separates the substrate 102 from both the conductors 202 and 702, as well as the substrate 102 from the second conductor 204. Other embodiments of the detector 200, besides those of FIGS. 6 and 7–8, can also be implemented.

Methods of use and manufacturing

Figure 9A:
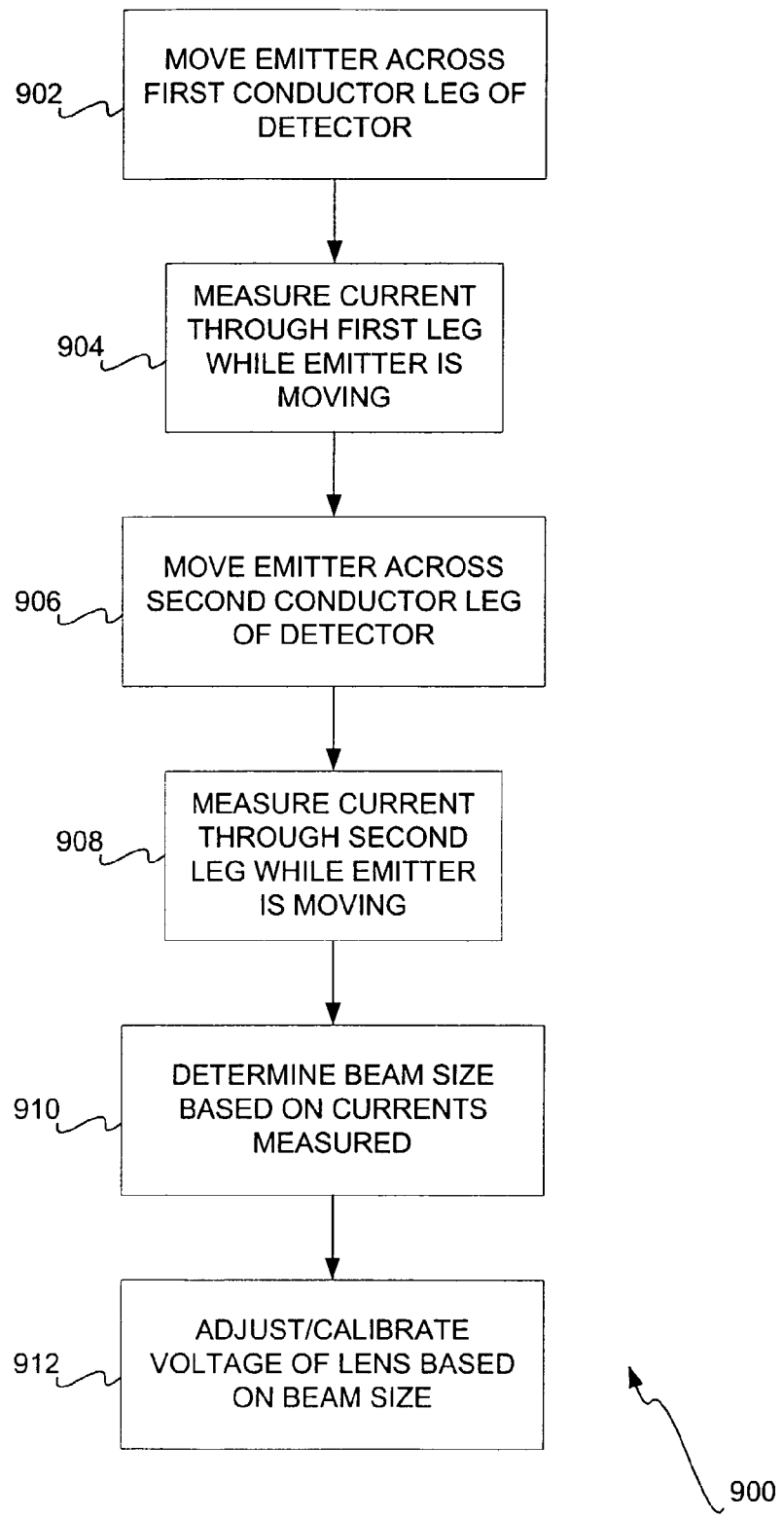
FIGS. 9A, 9B, and 10 are flowcharts of methods of use, according to varying embodiments of the invention.
Figure 9B:
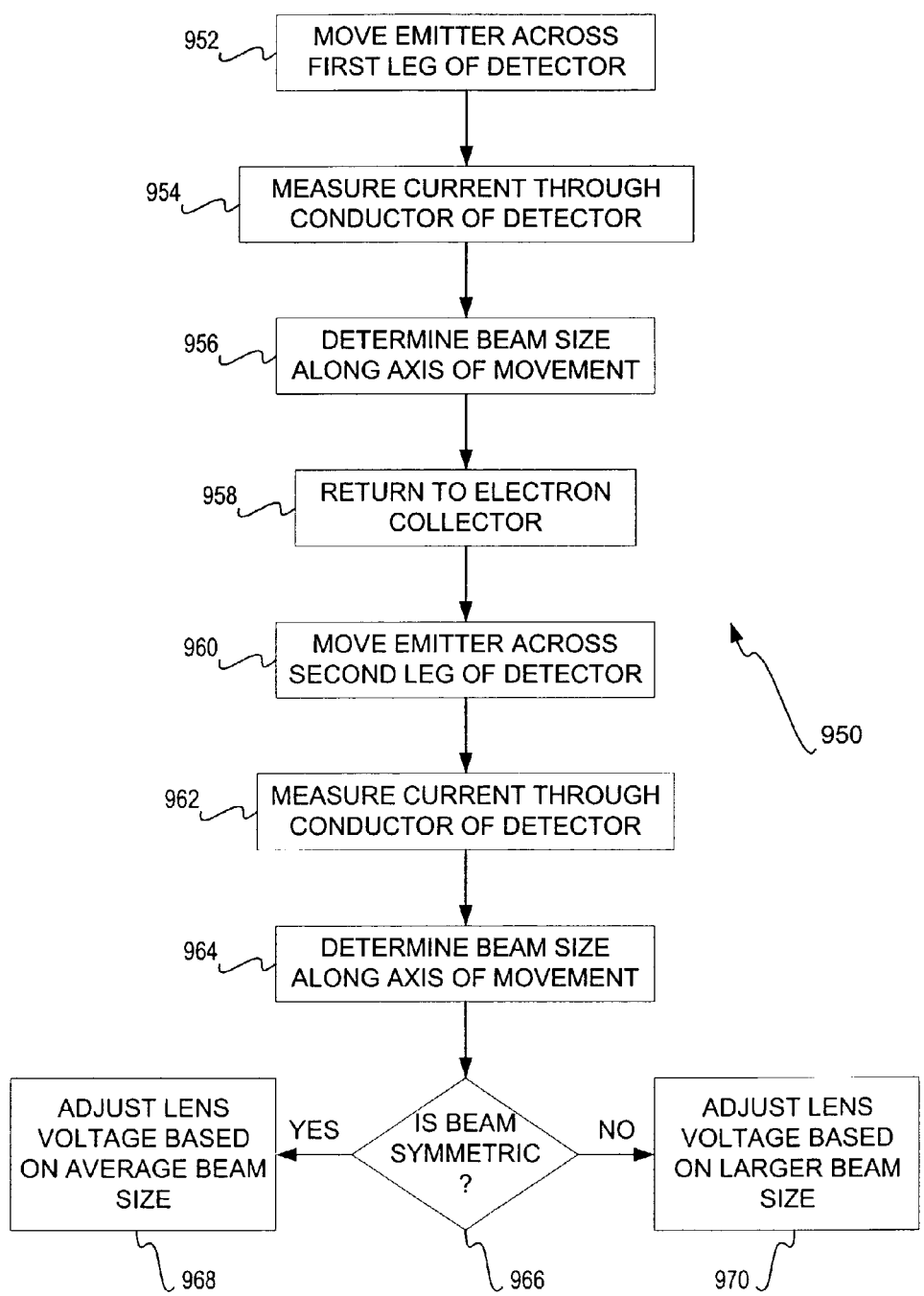
Figure 10:
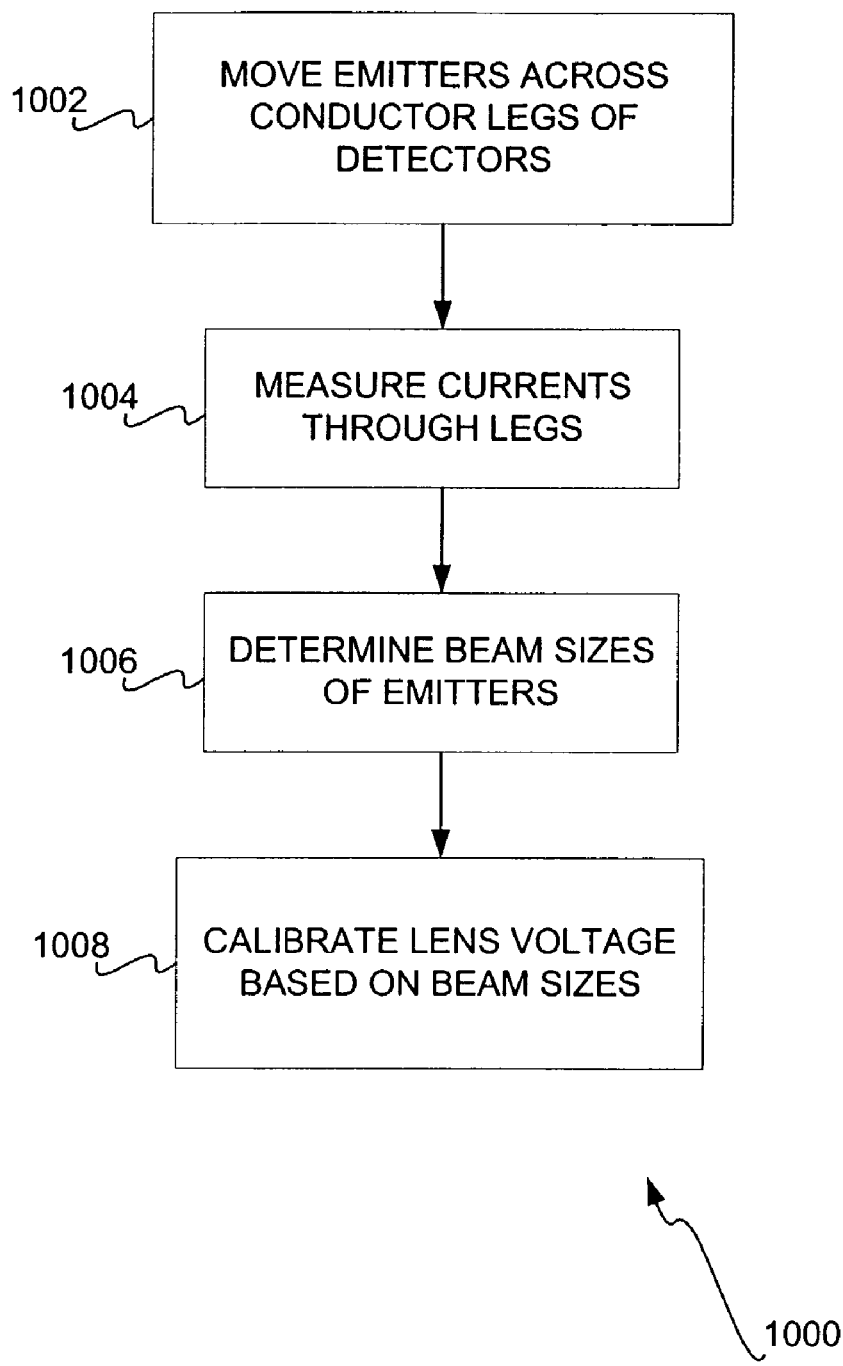

FIGS. 9A, 9B, and 10 show methods 900 and 1000, respectively, according to embodiments of the invention that are consistent with the method 400 of the embodiment of FIG. 4. The method 400 of FIG. 4 depicts how the beam size is determined based on moving the emitter 156 and thus its emitted beam 110 across the leg 208 of the second conductor 204 of the detector 200 of FIG. 2. The methods 900 and 950 of FIGS. 9A and 9B more specifically depict different ways as to how beam sizes are determined based on moving the emitter 156 and thus its beam across each of the legs 208 and 206 of the conductor 204 of the detector 200 of FIG. 2. The method 1000 of FIG. 10 depicts how beam sizes are determined based on moving emitters and their beams across the legs of the conductors of multiple detectors, such as the detectors 200A, 200B, and 200C of FIG. 3.

In FIG. 9A, the emitter is moved across the first conductor leg of the detector (902), such that the current through this first leg is measured as the emitter so moves (904). The emitter is then moved across the second conductor leg of the detector (906), such that the current through this second leg is also measured as the emitter so moves (908). Based on these currents measured, the beam size of the emitted beam of the emitter can be determined relative to the position of the emitter position over the detector (910). The voltage of the focusing lens can then be adjusted or calibrated based on the beam size (912), to achieve a desired beam size, depending on the position of the emitter.

The method 950 of FIG. 9B is described specifically in relation to FIG. 2, for explanatory clarity. In FIG. 9B, the emitter is moved across the first conductor leg 208 of the detector 200 (952). As the emitter moves across the detector 200, the current induced within the conductor 204 is measured (954). The size of the emitted beam along the axis of movement of the emitter is determined based on the current measured (956). The emitter is then returned to its original position over the electron collector 202 (958). The emitter and its emitted beam are next moved across the second conductor leg 206 of the detector 200 (960). As the emitter moves across the detector 200, the current induced within the conductor 204 by the emitted beam is measured (962). The size of the emitted beam along this axis of movement of the emitter is also determined based on the current measured (964).

The two beam measurements are compared to determine the symmetry of the beam along the two axes of movement of the emitter (966). If the beam is determined to be symmetric, the lens voltage is adjusted based upon the mean beam size (968). If the beam is determined to be asymmetrical, the lens voltage is adjusted based upon the larger beam size (970). Subsequent beam measurements and lens adjustments may also be made to determine whether the beam is converging or diverging and to achieve the desired beam size. The size of the emitted beam can be varied along each axis of movement as well.

In FIG. 10, the emitters corresponding to the detectors are moved across the conductor legs of the detectors (1002), such that the currents through the legs are measured (1004). The beam size of each emitter can thus be determined relative to the position of each emitter (1006). A universal focusing lens voltage over the entire wafer on which the detectors are located is then determined and the lens is calibrated (1008), so that whenever an emitter needs to emit an emitted beam over a part of the wafer, the proper voltage is used to achieve the desired beam spot size.

Figure 11:
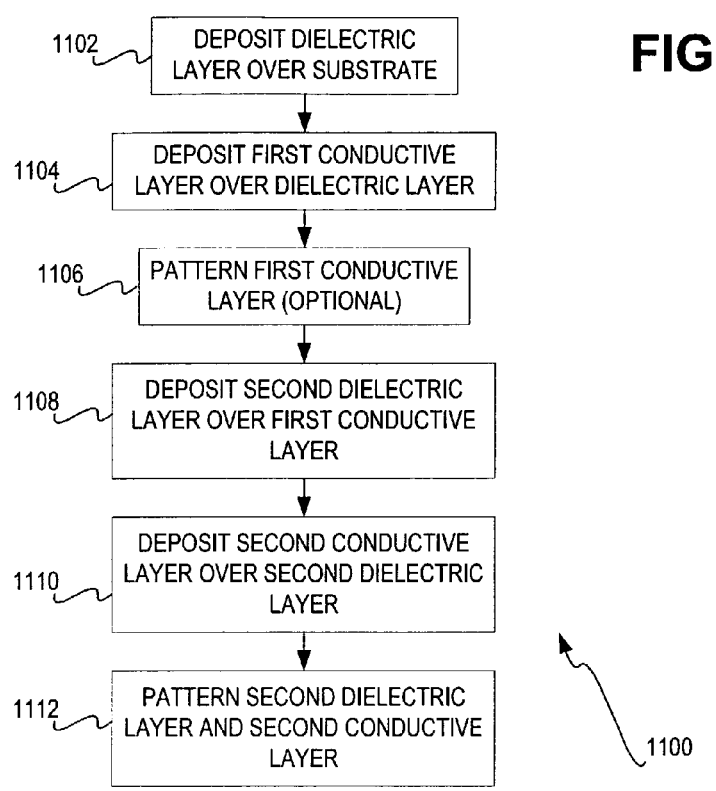
FIG. 11 is a flowchart of a method of manufacture, according to an embodiment of the invention.

FIG. 11 shows a method 1100 for constructing the detector 200 of FIGS. 2 and 6, according to an embodiment of the invention. First, a dielectric layer is deposited over a substrate of the re-recordable data storage medium (1102). In FIG. 6, this is the dielectric layer 602, over the substrate 102. A first conductive layer is deposited over the dielectric layer (1104), which is optionally pattern to be rectangularly shaped (1106). In FIG. 6, this is the first conductor 202 over the dielectric layer 602. A second dielectric layer is deposited over the first conductive layer (1108), and a second conductive layer is deposited over the second dielectric layer (1110). The second dielectric layer and the second conductive layer are finally patterned so that they are L-shaped (1112). In FIG. 6, this is the dielectric layer 604 and the second conductor 204.

Mass storage device

Figure 12:
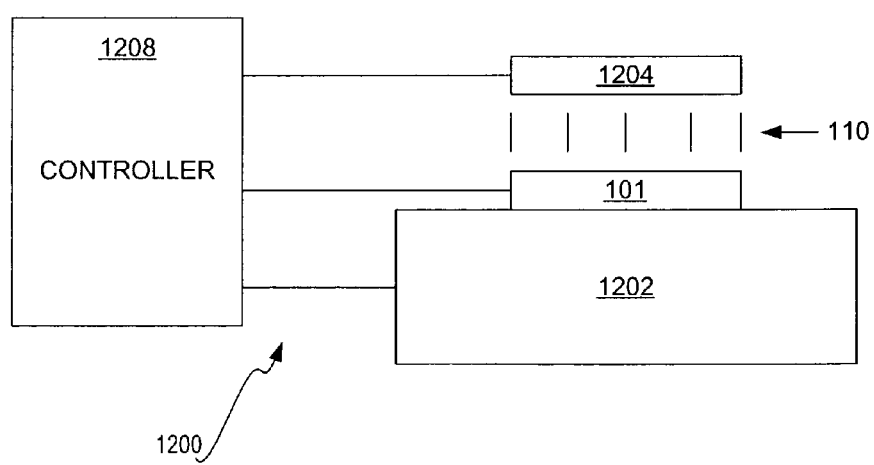
FIG. 12 is a diagram of a mass storage device, according to an embodiment of the invention.

FIG. 12 shows a diagram of a rudimentary mass storage device 1200 that can be used to read data from and write data to the re-recordable data storage medium 101, according to an embodiment of the invention. The medium 101 may be the medium 101 of the embodiments of FIGS. 1A and 1B, which includes one or more of the detectors of the embodiment of FIG. 2 thereon. The medium 101 is placed on a block 1202. More generally, the block 1202 is an instance of a mechanism that is receptive to the storage medium 101. An array of emitters 1204 corresponding to the memory cells of the medium 101 is positioned over the medium 101, where preferably each emitter corresponds to a cell of the medium 101. The array of emitters 1204 may be a field array, or another type of array, of emitters, and generates the emitted beams 110.

A controller 1208 is able to selectively turn on and off individual beams of the array 1204, at varying desired intensities, for reading and writing logical values from and to memory cells of the medium 101. The controller 1208 is also able to detect the signal at the medium 101, such as the current flowing through the storage medium 101, for reading logical values stored in memory cells of the medium 101. The controller 1208 more generally is an instance of a mechanism for performing this functionality. Thus, the controller 1208 reads the stored logical value of a selected memory cell of the medium 101 by controlling the corresponding emitter of the array 1204 to illuminate the cell at low energy, and writes a desired logical value of a selected cell by controlling the corresponding emitter to illuminate the cell at high energy.

CONCLUSION

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

We claim:

1. A method comprising:
   moving an emitter having an emitted beam across a conductor of a detector of a data storage medium;
   measuring current through the conductor resulting from the emitted beam as the emitter moves across the detector; and,
   determining a size of the emitted beam of the emitter based on a position of the emitter and the current measured.

2. The method of claim 1, further comprising adjusting a voltage of a focusing lens based on the size of the emitted beam to achieve a desired size of the emitted beam.

3. The method of claim 1, wherein moving the emitter comprises moving the emitter from a second conductor of the detector to the conductor of the detector.

4. The method of claim 1, wherein measuring the current through the conductor comprises measuring the current generated by the emitted beam of the emitter.

5. The method of claim 4, wherein the current generated by the emitted beam corresponds to a Gaussian profile.

6. The method of claim 1, wherein determining the size of the emitted beam comprises:
   determining a first position of the emitted beam relative to the detector; determining a second position of the emitted beam relative to the detector; and,
   subtracting the first and second positions to determine the size of the emitted beam.

7. The method of claim 6, wherein the first position of the emitted beam corresponds to a measured current that is 90% of maximum intensity, and the second position of the emitted beam corresponds to a measured current that is 10% of maximum intensity.

8. The method of claim 1, wherein determining the size of the emitted beam comprises determining two positions of the emitter relative to the detector where the current has been measured at a given value.

9. The method of claim 8, wherein determining the size of the emitted beam comprises determining the two positions of the emitter where the current has been measured at 50% of maximum intensity.

10. A method comprising:
    moving an emitter having an emitted beam across a first position of a conductor of a detector of a data storage medium;
    measuring current through the conductor resulting from the emitted beam as the emitter moves across the first position of the conductor;
    moving the emitter across a second position of the conductor;
    measuring current through the conductor resulting from the emitted beam as the emitter moves across the second position of the conductor;
    determining dimensions of the emitted beam of the emitter relative to the detector based on the current measured through the first and the second positions of the conductor; and,
    calibrating a voltage of a focusing lens based on the dimensions of the emitted beam to achieve a desired size of the emitted beam.

11. The method of claim 10, wherein measuring the current through the first and the second positions of the conductor each comprises measuring the current as corresponding to a beam profile.

12. The method of claim 11, wherein measuring the current as corresponding to the beam profile comprises measuring the current as corresponding to an integration of an electron beam profile of the emitted beam of the emitter.

13. The method of claim 10, wherein determining the dimensions of the emitted beam of the emitter relative to the position of the emitter comprises:
    determining a first dimension of the emitted beam as a position of the emitter where the current through the first conductor position has been measured at a first percentage of maximum intensity, minus a position of the emitter where the current through the first conductor position has been measured at a second percentage of maximum intensity; and,
    determining a second dimension of the emitted beam as a position of the emitter where the current through the second conductor position has been measured at a first percentage of maximum intensity, minus a position of the emitter where the current has been measured at a second percentage of maximum intensity.

14. A method comprising:
    moving a plurality of emitters having emitted beams across a first position of a conductor corresponding to a plurality of detectors positioned on a re-recordable data storage medium;
    moving a plurality of emitters having emitted beams across a second position of a conductor corresponding to a plurality of detectors positioned on a re-recordable data storage medium;
    measuring current through each conductor of each detector resulting from the emitted beam of a corresponding one of the emitters as the corresponding one of the emitters moves there across;
    determining dimensions of the emitted beams of the plurality of emitters relative to positions of the plurality of the emitters based on the currents measured; and,
    determining a focusing lens voltage based on the dimensions of the emitted beams to achieve a desired emitted beam dimension for each of the plurality of emitters.

15. The method of claim 14, wherein the conductor is L-shaped and has two legs, the first and second positions corresponding to the two legs.

16. The method of claim 15, wherein measuring the current through each leg of the L-shaped conductor comprises measuring the current as corresponding to an electron beam profile.

17. The method of claim 16, wherein measuring the current as corresponding to the electron beam profile comprises measuring the current as corresponding to an integration of an electron beam profile of the emitted beam of the emitter.

18. A detector for a re-recordable data storage medium to assist determining a dimension of an emitted beam of an emitter used to read from and write to the medium, comprising:

a first conductor to collect electrons from the emitted beam of the emitter; and, a second conductor to determine the dimension of the emitted beam based on current therethrough, the second conductor positioned relative to the first conductor such that the first conductor and the second conductors form an edge, wherein the first conductor includes a first portion separate from a second portion thereof, and the second conductor is positioned between the first portion and the second portion of the first conductor.

19. The detector of claim 18, wherein the second conductor is positioned over the first conductor such that the first conductor is partially exposed.

20. The detector of claim 19, further comprising a dielectric similarly sized to the second conductor positioned between the first conductor and the second conductor.

21. The detector of claim 19, wherein the second conductor is smaller in size than the first conductor.

22. The detector of claim 18, wherein the second conductor is L-shaped.

23. The detector of claim 18, wherein the second conductor is L-shaped, and the second portion of the first conductor is L-shaped.

24. The detector of claim 18, wherein the second conductor and the first and the second portions of the first conductor define gaps therebetween.

25. The detector of claim 18, further comprising a dielectric similarly sized to the first conductor positioned under the first conductor.

26. The detector of claim 18, wherein the emitter moves from over the first conductor to over the second conductor.

27. A detector for a data storage medium to assist determining a size of an emitted beam of an emitter used to read from and write to the medium, comprising:

an electron collector to collect electrons from the emitted beam of the emitter; and, means for determining the size of the emitted beam based on current therethrough, wherein the means is positioned between a first portion and a second portion of the electron collector.

28. The detector of claim 27, wherein the means is positioned relative to the electron collector such that the electron collector and the means form an edge.

29. The detector of claim 27, wherein the means is positioned over the electron collector such that the electron collector is partially exposed.

30. A detector for a data storage medium for determining a size of an emitted beam of an emitter used to read from and write to the medium, the detector constructed by performing a method comprising:

depositing a dielectric layer over a substrate of the medium;

depositing a first conductive layer over the dielectric layer;

depositing a second dielectric layer over the first conductive layer;

depositing a second conductive layer over the second dielectric layer; and, patterning the second dielectric layer and the second conductive layer to form an edge between the first and second conductive layers.

31. The detector of claim 30, the method further comprising, after depositing the first conductive layer, patterning the first conductive layer through to the dielectric layer such that the first conductive layer is rectangularly shaped.

* * * * *